United States Patent
Heine et al.

(10) Patent No.: US 6,908,775 B2
(45) Date of Patent: Jun. 21, 2005

(54) METHOD FOR PERFORMING AN ALIGNMENT MEASUREMENT OF TWO PATTERNS IN DIFFERENT LAYERS ON A SEMICONDUCTOR WAFER

(75) Inventors: Rolf Heine, Dresden (DE); Sebastian Schmidt, Dresden (DE); Thorsten Schedel, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/713,690

(22) Filed: Nov. 14, 2003

(65) Prior Publication Data
US 2004/0101984 A1 May 27, 2004

Related U.S. Application Data

(63) Continuation of application No. PCT/EP02/04834, filed on May 2, 2002.

(30) Foreign Application Priority Data

May 14, 2001 (EP) ............................................. 01111670

(51) Int. Cl.[7] ........................ H01L 21/66; G01R 31/26
(52) U.S. Cl. ........................ 438/14; 438/16; 438/401; 438/462; 438/800; 356/237.4; 356/401; 356/399
(58) Field of Search ........................ 438/14, 16, 401, 438/462, 800; 356/237.4, 401, 399; 430/22

(56) References Cited

U.S. PATENT DOCUMENTS

| | | | | |
|---|---|---|---|---|
| 5,621,813 A | | 4/1997 | Brown et al. | |
| 5,621,913 A | * | 4/1997 | Tuttle et al. | 455/41.2 |
| 6,023,338 A | * | 2/2000 | Bareket | 356/401 |
| 6,043,134 A | * | 3/2000 | Bishop | 438/401 |
| 6,068,954 A | * | 5/2000 | David | 430/22 |
| 6,079,256 A | * | 6/2000 | Bareket | 73/105 |
| 6,259,525 B1 | * | 7/2001 | David | 356/399 |
| 6,357,131 B1 | * | 3/2002 | Cheng et al. | 33/645 |
| 6,486,954 B1 | * | 11/2002 | Mieher et al. | 356/401 |

* cited by examiner

Primary Examiner—Matthew Smith
Assistant Examiner—B. V. Keshavan
(74) Attorney, Agent, or Firm—Laurence A. Greenberg; Werner H. Stemer; Gregory L. Mayback

(57) ABSTRACT

In an alignment or overlay measurement of patterns on a semiconductor wafer an error that occurs during the measurement in one of a predefined number of alignment structures in an exposure field of a corresponding predefined set of exposure fields can be handled by selecting an alignment structure in a substitute exposure field. The latter exposure field need not be part of the predefined set of exposure fields, that is, an inter-field change may be effected. The number of alignment measurements on a wafer remains constant and the quality is increased. Alternatively, when using another alignment structure in the same exposure field—by effecting an intra-field change—the method becomes particularly advantageous when different minimum structure sizes are considered for the substitute targets. Due to the different selectivity in, say, a previous CMP process, such targets might not erode and do not cause an error in a measurement, thus providing an increased alignment or overlay quality.

10 Claims, 2 Drawing Sheets

METHOD FOR PERFORMING AN ALIGNMENT MEASUREMENT OF TWO PATTERNS IN DIFFERENT LAYERS ON A SEMICONDUCTOR WAFER

CROSS-REFERENCE TO RELATED APPLICATION

This application is a continuation of copending International Application No. PCT/EP02/04834, filed May 2, 2002, which designated the United States and was published in English.

BACKGROUND OF THE INVENTION

Field of the Invention

The invention lies in the semiconductor processing field. More specifically, the present invention relates to a method for measuring an alignment of two patterns in different layers on a semiconductor wafer. A set of exposure fields having a fixed number of fields are selected for the alignment measurement and each of the exposure fields are provided with at least one alignment structure.

Throughout this document the term alignment structure refers to any measurement mark used for identifying absolute or relative positions on a semiconductor wafer, for example alignment marks for aligning a wafer on a stage in an exposure tool or overlay targets for comparing the deviation of two patterns in different layers or registration marks for measuring absolute positions on a wafer by comparison with reference data, which can originate from a library or a reference wafer.

Due to the rapidly decreasing minimum structure sizes of integrated circuits, strong requirements are set to the minute exposure of a semiconductor wafer with a mask pattern. An accurate overlay is commonly accomplished by aligning a dedicated alignment mark that has been structured on the wafer surface in a previous exposure step, i.e., the recent layer, with another alignment mark being associated with a mask pattern to be projected onto the wafer in the current step.

In an exposure tool, this alignment of the semiconductor wafer is performed prior to exposure by a position comparison of the structured alignment mark of the recent layer with the virtual, not yet projected alignment mark of the current layer.

After exposure, the accuracy of the alignment thus performed can be monitored in an overlay tool, where the position of associated alignment marks—both now being structured in subsequent layers—can be measured in the x-direction and the y-direction, and the difference between them then being compared with a threshold value.

Current overlay specifications require a maximum overlay tolerance of 35–50 nm in the case of high-end products. The alignment marks, of which the position differences are measured during exposure alignment or overlay control, are commonly positioned in the scribelines, or frames of each exposure field on the wafer. A common alignment procedure during exposure is to select a set of exposure fields already structured in the previous exposure step having a predefined number of position. In each of these, e.g. nine exposure fields, four alignment marks are measured in x- and y-direction and compared against their virtual counterpart through the optics. Having determined the position differences, shift, scaling, and rotation of the current layer to be projected with respect to the previous layer is known and the position and movement of the wafer stage can be adjusted.

The information associated with the selected set of exposure fields determined for alignment is commonly tabulated and read out by the alignment control software, which automatically performs each of the alignment measurement steps.

A similar procedure is valid for the overlay control. In several post-processing steps such as chemical-mechanical polishing (CMP) or etching, the alignment marks structured in a previous exposure step are often damaged or obscured, particularly if some process change occurred. In these cases, the structure of the alignment marks has to be adapted to the process and changes therefore may lead deteriorated alignment marks. Thus, a sufficient alignment procedure, or overlay control, is in many instances not feasible, particularly if the processes described above occur systematically, e.g. at the wafer edges. Therefore, the alignment quality decreases resulting in a lowered wafer yield.

To circumvent this, overlay or alignment control programs commonly flag other signals if preselected exposure fields and alignment marks cannot be detected or give two poor measurement signals. Unfortunately, the system then needs operator input how to proceed with the present case, which consumes expensive time and requires larger operator staff.

SUMMARY OF THE INVENTION

It is accordingly an object of the invention to provide a method for performing an alignment measurement that overcomes the above-mentioned disadvantages of the heretofore-known devices and methods of this general type and which decreases the time needed for an alignment measurement or overlay measurement of a semiconductor wafer and to increase the wafer yield.

With the foregoing and other objects in view there is provided, in accordance with the invention, a method for performing an alignment measurement of two patterns in different layers on a semiconductor wafer, with a set of a fixed number of exposure fields selected for the alignment measurement, and with each of the exposure fields having at least one alignment structure, the method which comprises the following method steps:

providing the semiconductor wafer to a processing tool for performing the alignment measurement;

selecting a first alignment structure in a first exposure field of the set with the fixed number of exposure fields;

performing an offset measurement using the first alignment structure, and issuing an error signal if the offset measurement is not feasible due to a poor alignment structure quality or an offset lies beyond a tolerance range;

in response to the error signal, selecting a second exposure field as a substitute, wherein the second exposure field is not included in the set of exposure fields on the semiconductor wafer except for the first exposure field;

selecting a second alignment structure in the second exposure field;

performing an offset measurement using the second alignment structure; and measuring a second relative offset of an alignment structure in a next exposure field of the set with the fixed number of exposure fields.

In other words, the objects of the invention are achieved by a method for performing an alignment measurement of two patterns in different layers on a semiconductor wafer, which comprises a set of exposure fields having a fixed number being selected for the alignment measurement, each of the exposure fields being provided with at least one alignment structure, comprising the steps of providing the semiconductor wafer to a processing tool for performing the alignment measurement, selecting a first alignment structure in a first one of the set of exposure fields having a fixed number, performing an offset measurement using the first alignment structure, with issuing an error signal representing the case that the offset measurement either is not feasible due to a poor alignment structure quality or provides an offset beyond a tolerance range, selecting a second exposure field in response to the error signal at a substitute, which is not included in the set of exposure fields on the semiconductor wafer with the exception of the first exposure field, selecting a second alignment structure in the second exposure field, performing an offset measurement using the second alignment structure, and continuing with measuring a second relative offset of an alignment structure in a next exposure field of the set of exposure fields.

According to the present invention, a different alignment structure, or alignment mark equivalently, is selected if the measurement of the position offset cannot be carried out. For example, this may be due to the obscuring or damaging effects as mentioned above. Instead of signaling an alarm to the operator for, e.g. interrupting the exposure process, a substitute alignment structure is chosen, which provides a still sufficient amount of data for performing the adjustment determination during the alignment step, or a full characterization of the overlay quality in a metrology inspection.

In order to retain the positions of the alignment mark across the wafer map constant as far as possible, the second alignment structure selected can be chosen from the same exposure field where the error occurred. Since the measurement of an additional alignment mark requires only a few seconds, while the overall quality is retained, a large amount of time is saved as compared with an operator intervention.

Most preferably, the alignment mark chosen from the same exposure field has a position in the vicinity of the damaged or obscured alignment structure. But the second alignment structure may also be selected from a different exposure field, which is not part of the set of exposure fields being preselected. In this case, the total number of selected exposure fields is also retained holding the amount of positional information constant that is necessary to perform the alignment.

The present method is preferably implemented in overlay or alignment control programs selecting the necessary exposure fields and alignment marks positions from a stored table. If the error signal is issued which represents the problem of poor alignment structure quality or offset tolerance violation, a substitute exposure field and alignment mark position which is preferably stored in the same table previously, thereby being associated with the initial fixed set of exposure fields and alignment marks. In such an example, each exposure field of the set of exposure fields has its own substitute exposure field.

The present method is applicable to any alignment or overlay measurement of a process tool in semiconductor wafer manufacturing. It is not restricted to exposure tools or overlay metrology tools, but can also be used in, e.g. alignment procedures for other metrology tools like defect inspection, scanning electron microscopes, or processing tools needing an alignment because they affect distinct parts of the wafer surface.

The position of the second exposure field with respect to the first exposure field can advantageously be adapted to the problem that is to be expected by the damaging or obscuring process, for example it can be the next exposure field in the same row of the wafer map, or it can generally be chosen to be the next exposure field in the direction of the wafer center or vice-versa. It is also possible that the second exposure field is randomly chosen, thereby always considering that an exposure field already being a member of the fixed number of exposure fields being preselected must not be measured twice. In a further aspect, the case that the second alignment mark also reveals problems with obscuration or damage is considered. According to the present invention, a third exposure field with a third alignment structure is then selected for performing the offset measurement of the alignment marks from the different layers. The procedure of selecting even further exposure fields as a substitute can be continued until a threshold number of substitute fields representing the case that obviously any alignment mark is obscured, or perhaps a wrong mask pattern is projected onto the already structured wafer surface.

A method for refining the idea of the present invention concerning a self-learning system using the results of repeatedly performing the method of the present invention as input to a neural network is considered. The neural network is trained using the steps according to the method of the present invention. If, for example, selected exposure field repeatedly result in a mismeasurement or flyer resulting in a misalignment, it reacts by altering the selection of substitution fields or even the predefined set of exposure fields. The same is valid for the selection of the alignment marks in an exposure field. This idea can also be implemented by fuzzy logic.

Since an alignment and overlay quality can be retained or even enhanced due to the selection of exposure fields and their substitutes, the wafer yield is increased and the time spent in system maintenance or repair is advantageously reduced.

With the above and other objects in view there is also provided, in accordance with the invention, a method for performing a series of alignment measurements of each two patterns in different layers on a semiconductor wafer. The method comprises:

training a neural network with the method steps outline in the foregoing;

issuing a signal with the neural network in case an error signal is detected repeatedly in offset measurements in different layers for at least one exposure field of the semiconductor wafer; and altering a selection of the set of exposure fields in response to the signal.

Other features which are considered as characteristic for the invention are set forth in the appended claims.

Although the invention is illustrated and described herein as embodied in a method for performing an alignment measurement of two patterns in different layers on a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
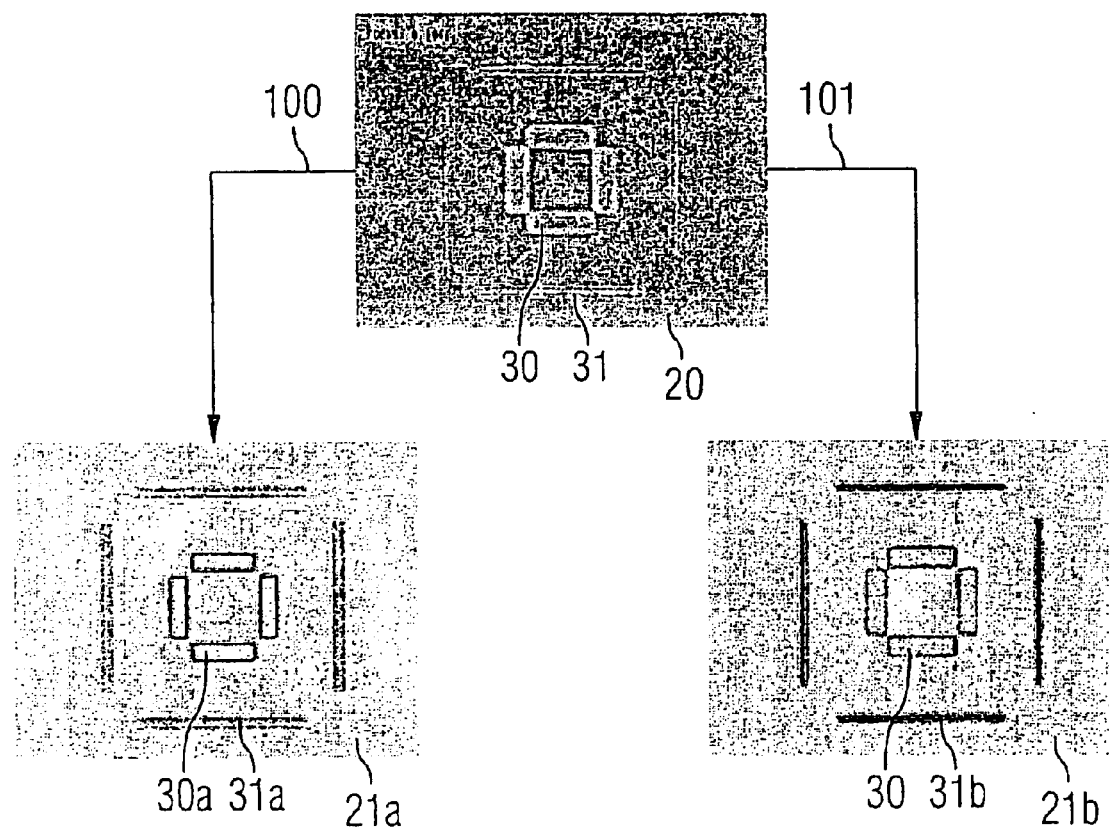
FIG. 1 is a plan view of a first alignment structure with poor quality initiating a selection of a different alignment structure in the same field (lower left) or in another field (lower right)

Referring now to the figures of the drawing in detail and first, particularly, to FIG. 1 thereof, there is shown in the upper portion of the figure an alignment structure 20 embodied as an overlay target to be measured in a metrology tool, which has poor quality due to previous processing steps. The alignment structure 20 is positioned in the upper left corner of the scribeline of each exposure field 2 of a semiconductor wafer 1. In this example the alignment structure 20 consists a) of 4 quadratically arranged twin-trenches formed in a previously structured deep trench layer of a 0.14 µm DRAM-pattern to form a reference target 31, and b) of four smaller equally structured bars in a resist layer, which is the gate contact layer, inside the square of the four twin-trenches, to provide a resist target 30.

An overlay measurement comprises measuring a deviation of the center of the resist target 30 with respect to the already structured reference target 31 of the previously formed layer. While the resist pattern 30 is clearly visible on the SEM-image in the upper portion of FIG. 1, the reference target 31 of the previously structured layer reveals a poor structure contrast due to, by way of example, a local focus spot having occurred during a recent exposure or due to chemical mechanical polishing (CMP), thereby being obliterated.

Figure 2:
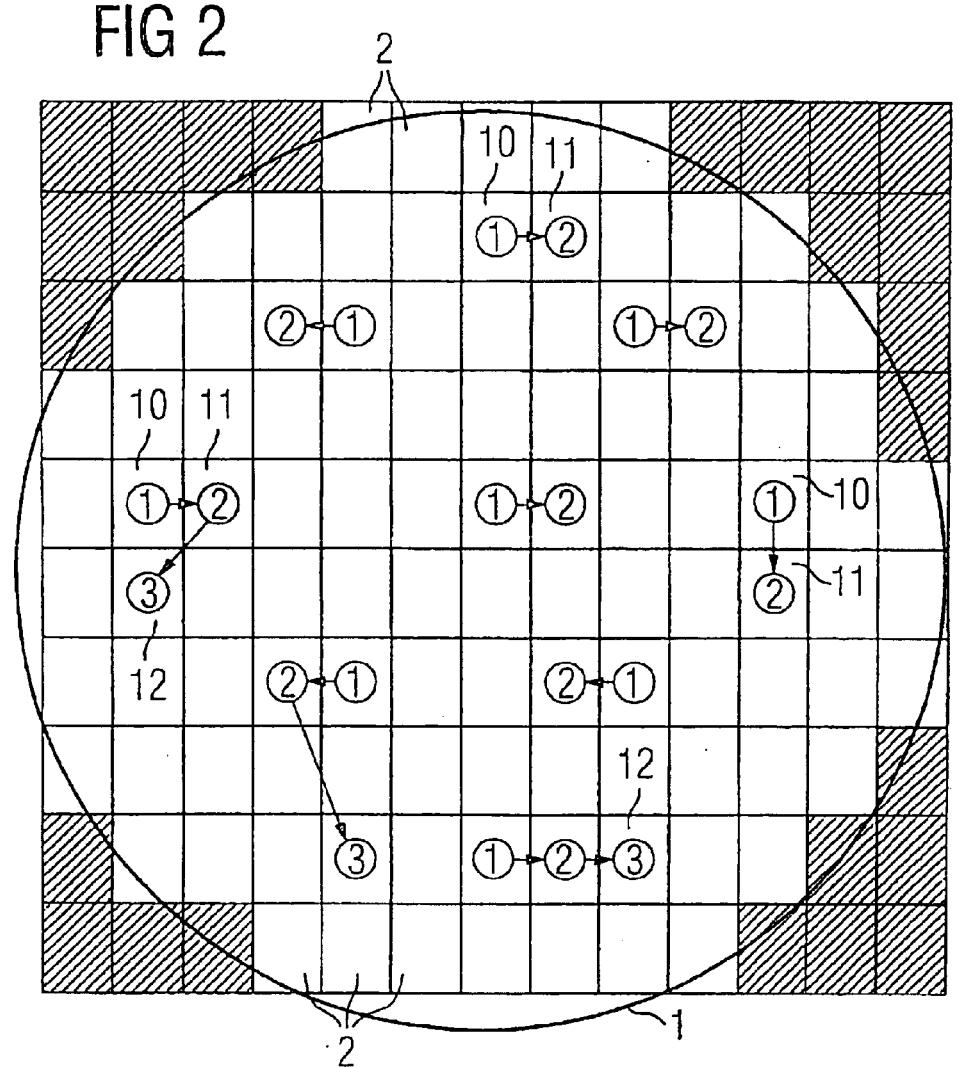
FIG. 2 is a diagrammatic exposure field map of a semiconductor wafer with exposure fields (1) with alignment marks selected for a measurement, and substitutes (2, 3)

If the alignment structure 20 is located an exposure field 2, which is part of the set of exposure fields 10 being selected for an alignment measurement, as shown in FIG. 2, the measurement of x-y-deviations in center positions of the respective layer patterns 30, 31 are hard to be carried out. In particular, the center position of the reference target 31 of the previously structured pattern is hard to be determined. The control unit of the metrology tool therefore generates an error signal indicating that an offset measurement is not feasible since either the alignment structure provides poor quality or cannot be detected at all. The error signal is then evaluated by the control program, which has access to a table comprising the position of a second alignment structure 21b in a substitute exposure field 11, which is uniquely associated with the previous exposure field 10. The relative position inside the exposure field 10, 11 is the same for both alignment structures 20, 21b.

If particularly local phenomena like focus spots led to the problem of obliteration of the alignment structure 20, the probability that an alignment measurement can be performed in the corresponding alignment structure 21b of an exposure field sufficiently far away is considerably greater than in the first exposure field. In the case of the alignment structure 21b in the lower right corner of FIG. 1 both center positions, i.e. the center position of the resist target 30 and of the twin-trench reference target 31b, can easily be measured, and thus an accurate overlay determination can be achieved. Therefore, the inter-field change 101 in FIG. 1 as performed by the metrology tool control program in response to the error signal provides a high degree of automation, thereby saving time and improving product quality.

In FIG. 1 another embodiment of the present invention is shown in the lower left corner. The control program of the metrology tool recognizes from the error signal content, which originates from a detection of poor quality in the alignment structure 20, that the problem with the twin-trench reference target 31 is particularly due to effects of chemical mechanical polishing (CMP). The problem can be circumvented by switching from the alignment target 20 with twin-trench reference targets 31 having a structure width of 0.4 µm to another alignment structure 21a in an exposure field 11, which is substantially the same as the exposure field 10 that has a trench reference target 31a with a structure width of 1.2 µm (with a single-trench).

This may be advantageous, if larger structure sizes do not suffer as strongly as small structure sizes. In this embodiment, the second alignment structure 21a has a distance of approximately 60 µm from the first alignment structure 20 having poor quality. The position of the second alignment structure 21a is also stored in a reference table used by the metrology tool control program to drive the optics to this position.

Thus, combined with the advantages of advanced process control providing information of possible problems occurring during recent processes including CMP or exposure, the control program of the metrology tool is able to determine whether to perform an inter-field change 101 or an intra-field change 100.

It is also possible to combine the two changes 100, 101 i.e. first to try out intra-field changes 100, and if that change provides no improvement, then to follow up with an inter-field change 101.

Figure 3:
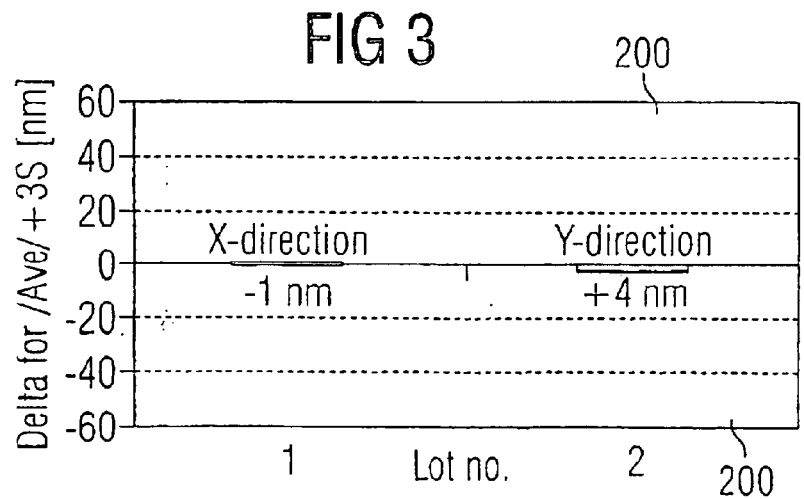
FIG. 3 is a graph established for matching substitute targets with standard targets.

A further improvement is achieved by applying corrections due to a measured reproducible offset between the intra-field substitute targets 21a and the standard targets 20 into the control overlay measurement. A corresponding measurement is shown in FIG. 3. There, an offset of −1 nm in overlay accuracy between the gate contact alignment pattern 30a of the alignment structure 21a as a substitute and the corresponding gate contact pattern 30 of the standard alignment structure 20 has been determined. The corresponding difference in the y-direction amounts to +4 nm. These results may be used as input corrections for those alignment measurements, where the first alignment structure 20 cannot be measured due to poor quality and is therefore skipped in favor of the substitute alignment structure 21a. As expected, these offsets are considerably smaller than typical overlay specifications 200 amounting to +/−60 nm. The values provided above were measured for the same lot, where both alignment structures 20, 21a provided feasible measurements.

As is also shown in FIG. 2 the second substitute exposure fields 11 of the nine selected exposure fields 10 do not require relative positions to the originating exposure field 10, which are arranged systematically, e.g. the next field to the right in all cases. Rather, they may individually be chosen by experience, or by implementing neural networks. This is particularly advantageous, if certain exposure fields repeatedly deliver mismeasurements, or if a certain relative position of a substitute exposure field 11 repeatedly provides high quality overlay measurements. The selected set may then be altered by incorporating the substitute exposure field 11 into the set, and by sorting out the exposure field 10 hitherto uniquely associated with it.

As a byproduct an operator is implicitly informed, that certain exposure fields are inflicted with problems, which is due to previous processing. This helps to faster identify the cause, e.g. locally enhanced particle contamination, chuck problems, lens problems etc. of the exposure tool or any other process tool in the fab.

We claim:

1. A method for performing an alignment measurement of two patterns in different layers on a semiconductor wafer, with a set of a fixed number of exposure fields selected for the alignment measurement, and with each of the exposure fields having at least one alignment structure, the method which comprises the following method steps:

provinding the semiconductor wafer to a processing tool for performing the alignment measurement;

selecting a first alignment structure in a first exposure field of the set with the fixed number of exposure fields;

performing an offset measurement using the first alignment structure, and issuing an error signal if the offset measurement is not feasible due to a poor alignment structure quality or an offset lies beyond a tolerance range;

in response to the error signal, selecting a second exposure field as a substitute, wherein the second exposure field is not included in the set of exposure fields on the semiconductor wafer except for the first exposure field;

selecting a second alignment structure in the second exposure field;

performing an offset measurement using the second alignment structure; and measuring a second relative offset of an alignment structure in a next exposure field of the set with the fixed number of exposure fields.

2. The method according to claim 1, wherein the second exposure field is the same as the first exposure field.

3. The method according to claim 2, which comprises selecting the second alignment structure in the same exposure field, such that a relative distance between the first alignment structure and the second alignment structure is more than 10 microns and less than 100 microns.

4. The method according to claim 3, which comprises selecting the second alignment structure such that a dimension of a minimum linewidth thereof is different from a minimum linewidth of the first alignment structure by at least 20 percent.

5. The method according to claim 2, which comprises selecting the second alignment structure such that a dimension of a minimum linewidth thereof is different from a minimum linewidth of the first alignment structure by at least 20 percent.

6. The method according to claim 2, which comprises:

issuing an error signal when performing the offset measurement using the second alignment structure representing a case that the offset measurement either is not feasible due to a poor alignment structure quality or the offset measurement provides an offset beyond the tolerance range;

in response to the error signal, selecting a third exposure field as a substitute, wherein the third exposure field is not included in the set of exposure fields on the semiconductor wafer with the exception of the first exposure field; and performing an offset measurement using a third alignment structure.

7. The method according to claim 1, wherein the second exposure field is different from the first exposure field.

8. The method according to claim 1, wherein the processing tool is an exposure tool, and the alignment measurement is performed to provide a wafer stage adjustment.

9. The method according to claim 1, wherein the processing tool is an overlay metrology tool, and the alignment measurement is performed to control a quality of a recent manufacturing process carried out on the semiconductor wafer.

10. A method for performing a series of alignment measurements of each two patterns in different layers on a semiconductor wafer having a set of a fixed number of exposure fields selected for the alignment measurement, with each of the exposure fields having at least one alignment structure, the method which comprises:

training a neural network with the method steps of claim 1;

issuing a signal with the neural network in case an error signal is detected repeatedly in offset measurements in different layers for at least one exposure field of the semiconductor wafer; and altering a selection of the set of exposure fields in response to the signal.

* * * * *